(12) United States Patent
Yamada

(10) Patent No.: US 6,760,244 B2
(45) Date of Patent: Jul. 6, 2004

(54) MAGNETIC MEMORY DEVICE INCLUDING STORAGE ELEMENTS EXHIBITING A FERROMAGNETIC TUNNEL EFFECT

(75) Inventor: Kouichi Yamada, Gifu (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 10/352,957

(22) Filed: Jan. 29, 2003

(65) Prior Publication Data

US 2003/0142527 A1 Jul. 31, 2003

(30) Foreign Application Priority Data

Jan. 30, 2002 (JP) ........................................ 2002-021552

(51) Int. Cl.[7] ................................................ G11C 5/06
(52) U.S. Cl. .......................................... 365/63; 365/171
(58) Field of Search ................................... 365/63, 171

(56) References Cited

U.S. PATENT DOCUMENTS

| 5,051,954 | A | 9/1991 | Toda et al. |
| 5,375,082 | A | 12/1994 | Katti et al. |
| 5,946,227 | A | 8/1999 | Naji |
| 6,111,781 | A | 8/2000 | Naji |
| 6,456,523 | B1 | 9/2002 | Tanaka et al. |
| 6,501,679 | B2 * | 12/2002 | Hidaka ........................ 365/173 |
| 6,542,402 | B2 * | 4/2003 | Hidaka ........................ 365/171 |
| 6,657,889 | B1 * | 12/2003 | Subramanian et al. ...... 365/158 |

FOREIGN PATENT DOCUMENTS

| EP | 0 613 148 A2 | 8/1994 |
| JP | 08/063962 | 3/1996 |
| JP | 09-293387 | 11/1997 |

OTHER PUBLICATIONS

Page 5, "Present Circumstances and Future Prospects of MRAM and Competitive Techniques" Data of the 116th Meeting of the Magnetic Society of Japan Nov. 17, 2000.
Nikkei Electronics 1999. 11. 15(No. 757)pp. 49–56.

* cited by examiner

Primary Examiner—Richard Elms
Assistant Examiner—Tuan T. Nguyen

(57) ABSTRACT

A memory device capable of rewriting data with smaller current consumption than a case of feeding a rewrite current every bit line is obtained. This memory device including a first bit line and a second bit line having a current path independently of the first bit line, and renders write current paths of the first and second bit lines in common. Thus, the memory device can rewrite data with smaller current consumption as compared with the case of feeding the rewrite current every bit line.

20 Claims, 8 Drawing Sheets

MAGNETIC MEMORY DEVICE INCLUDING STORAGE ELEMENTS EXHIBITING A FERROMAGNETIC TUNNEL EFFECT

BACKGROUND OF THE INVENTION

1. Field of the Invention

The present invention relates to a memory device, and more specifically, it relates to a memory device such as a magnetic memory device including storage elements exhibiting a ferromagnetic tunnel effect or the like.

2. Description of the Background Art

An MRAM (magnetic random access memory), i.e., a nonvolatile memory recording data through magnetism, is known in general. This MRAM is disclosed in Nikkei Electronics, 1999. 11. 15 (No. 757), pp. 49–56 or the like in detail.

FIGS. 7 and 8 are schematic diagrams for illustrating the structure of a storage element 110 forming the MRAM disclosed in the aforementioned literature. Referring to FIG. 7, the storage element 110 of the conventional MRAM comprises a ferromagnetic layer 101, another ferromagnetic layer 103 and a non-magnetic layer 102 arranged between the ferromagnetic layers 101 and 103.

The ferromagnetic layer 101 is harder to invert than the ferromagnetic layer 103. The term "ferromagnetism" denotes such magnetism that magnetic atoms or free atoms of a metal parallelly align magnetic moments due to positive exchange interaction for forming spontaneous magnetization, and a substance exhibiting such ferromagnetism is referred to as a ferromagnetic substance. The ferromagnetic layers 101 and 103 consist of such a ferromagnetic substance. In general, the non-magnetic layer 102 is formed by a GMR (giant magnetoresistance) film employing a metal. A TMR (tunneling magnetoresistance) film employing an insulator has recently been developed as the non-magnetic layer 102. The TMR film advantageously has larger resistance than the GMR film. More specifically, the MR ratio (resistance change) of the GMR film is on the 10% mark, while that of the TMR film is at least 20%. The storage element 110 consisting of the TMR film is hereinafter referred to as a TMR element 110.

The storage principle of the conventional MRAM employing the TMR element 110 is now described with reference to FIGS. 7 and 8. First, the state where the directions of magnetization of the two ferromagnetic layers 101 and 103 are identical to each other (parallel) is associated with data "0", as shown in FIG. 7. The state where the directions of magnetization of the two ferromagnetic layers 101 and 103 are opposite to each other (antiparallel) is associated with data "1", as shown in FIG. 8. The TMR element 110 exhibits small resistance ($R_0$) when the directions of magnetization are parallel, while exhibiting large resistance ($R_1$) when the directions of magnetization are antiparallel. The MRAM determines whether the data is "0" or "1" through the property of the TMR element 110 exhibiting different resistance values in response to the directions of magnetization.

FIG. 9 is a block diagram showing the overall structure of a conventional MRAM 150 having memory cells each formed by a single TMR element and a single transistor. The structure of the conventional MRAM 150 is now described with reference to FIG. 9.

A memory cell array 151 is formed by arranging a plurality of memory cells 120 in the form of a matrix (FIG. 9 shows only four memory cells 120, in order to simplify the illustration). Each memory cell 120 is formed by a single TMR element 110 and a single NMOS transistor 111.

In the memory cells 120 arranged in a row direction, the gates of the NMOS transistors 111 are connected to common read word lines $RWL_1$ to $RWL_n$. In the memory cells 120 arranged in the row direction, further, rewrite word lines $WWL_1$ to $WWL_n$ are arranged on first ferromagnetic layers of the TMR elements 110.

In the memory cells 120 arranged in a column direction, first ferromagnetic layers of the TMR elements 110 are connected to common bit lines $BL_1$ to $BL_n$.

The read word lines $RWL_1$ to $RWL_n$ are connected to a row decoder 152, and the bit lines $BL_1$ to $BL_n$ are connected to a column decoder 153.

Externally specified row and column addresses are input in an address pin 154. The address pin 154 transfers the row and column addresses to an address latch 155. In the row and column addresses latched in the address latch 155, the row address is transferred to the row decoder 152 through an address buffer 156, and the column address is transferred to the column decoder 153 through the address buffer 156.

The row decoder 152 selects a read word line RWL corresponding to the row address latched in the address latch 155 from among the read word lines $RWL_1$ to $RWL_n$, while selecting a rewrite word line WWL corresponding to the row address latched in the address latch 155 from among the rewrite word lines $WWL_1$ to $WWL_n$. The row decoder 152 further controls the potentials of the read word lines $RWL_1$ to $RWL_n$ and the rewrite word lines $WWL_1$ to $WWL_n$ on the basis of a signal from a voltage control circuit 157.

The column decoder 153 selects a bit line BL corresponding to the column address latched in the address latch 155 from among the bit lines $BL_1$ to $BL_n$, while controlling the potentials of the bit lines $BL_1$ to $BL_n$ on the basis of a signal from another voltage control circuit 158.

Externally specified data is input in a data pin 159. The data pin 159 transfers the data to the column decoder 153 through an input buffer 160. The column decoder 153 controls the potentials of the bit lines $BL_1$ to $BL_n$ in correspondence to the data.

Data read from an arbitrary memory cell 120 is transferred from any of the bit lines $BL_1$ to $BL_n$ to a sense amplifier group 161 through the column decoder 153. The sense amplifier group 161 is formed by current sense amplifiers. The data determined by the sense amplifier group 161 is output from an output buffer 162 through the data pin 159.

A control core circuit 163 controls the aforementioned operations of the circuits 152 to 162.

A write (rewrite) operation and a read operation of the conventional MRAM 150 having the aforementioned structure are now described.

(Write Operation)

In the write operation, the MRAM 150 feeds orthogonal currents to the selected rewrite word line WWL and the selected bit line BL. Thus, data can be rewritten only in the TMR element 110 located on the intersection between the rewrite word line WWL and the bit line BL. More specifically, the currents flowing through the rewrite word line WWL and the bit line BL form magnetic fields, so that the sum (composite field) of the two magnetic fields acts on the TMR element 110. The directions of magnetization of the TMR element 110 change from "1" to "0", for example, due to the composite field.

The remaining TMR elements 110 located on intersections excluding the aforementioned one include those fed with absolutely no currents and those fed with only unidirectional currents. In each TMR element 110 fed with no current, no magnetic fields are formed and hence the directions of magnetization remain unchanged. In each TMR element 110 fed with only a unidirectional current, formed magnetic fields are insufficient in strength for inverting the directions of magnetization. Therefore, the directions of magnetization remain unchanged also in the TMR element 110 fed with only a unidirectional current.

As hereinabove described, the MRAM 150 can write the directions of magnetization of the TMR element 110 located on the intersection between the selected bit line BL and the selected rewrite word line WWL as shown in FIG. 7 or 8 by feeding the currents to the bit line BL and the rewrite word line WWL corresponding to the selected address. Thus, the MRAM 150 can write data "0" or "1".

(Read Operation)

In order to read the data written in the aforementioned manner, the MRAM 150 applies a voltage to the read word line RWL for rendering the NMOS transistor 111 conductive. In this state, the MRAM 150 determines whether the value of the current flowing through the bit line BL is larger or smaller than a reference current value, thereby determining "1" or "0".

In the case of the data "0" shown in FIG. 7, the directions of magnetization are parallel and hence the TMR element 110 exhibits a small resistance value ($R_0$). Therefore, the value of the current flowing through the bit line BL is larger than the reference current value. In the case of the data "1" shown in FIG. 8, on the contrary, the directions of magnetization are antiparallel and hence the TMR element 110 exhibits a larger resistance value ($R_1$) than that in the case shown in FIG. 7. Therefore, the value of the current flowing through the bit line BL is smaller than the reference current value.

The aforementioned conventional MRAM 150 feeds the orthogonal currents to the selected rewrite word line WWL and the selected bit line BL in order to write data. If the TMR element 110 is refined, however, the directions of magnetization are so hard to invert that it is difficult to rewrite the data unless the values of the currents for writing are increased. Further, the conventional MRAM 150, which must feed a current every bit line in order to simultaneously rewrite data in the memory cells 120 connected to the selected rewrite word line WWL, requires currents in a number corresponding to the product of the current necessary for each memory cell 120 and the number of the bit lines $BL_1$ to $BL_n$. Thus, the MRAM 150 disadvantageously requires extremely large currents.

The MRAM 150 also requires rewrite currents in a number corresponding to the product of a rewrite cycle and the number of the bit lines $BL_1$ to $BL_n$ in order to continuously rewrite data stored in the memory cells 120 connected with the selected rewrite word line WWL. Thus, the MRAM 150 requires large currents also in this case.

SUMMARY OF THE INVENTION

An object of the present invention is to provide a memory device capable of rewriting data with smaller current consumption as compared with a case of feeding a rewrite current every bit line.

Another object of the present invention is to easily connect current paths of first and second bit lines with each other in the aforementioned memory device.

In order to attain the aforementioned objects, a memory device according to a first aspect of the present invention comprises a first bit line and a second bit line having a current path independently of the first bit line, while rendering write current paths of the first bit line and the second bit line in common.

The memory device according to the first aspect can rewrite data with smaller current consumption as compared with a case of feeding a rewrite current every bit line by rendering the rewrite current paths of the first bit line and the second bit line having the current path independently of the first bit line in common as hereinabove described.

A memory device according to a second aspect of the present invention comprises a first bit line, a first pair line paired with the first bit line, a second bit line, a second pair line paired with the second bit line and a current path control circuit connecting either the first bit line or the first pair line and either the second bit line or the second pair line with each other in writing thereby connecting current paths of the first bit line and the second bit line with each other.

The memory device according to the second aspect is provided with the current path control circuit connecting either the first bit line or the first pair line and either the second bit line or the second pair line with each other in writing thereby connecting the current paths of the first bit line and the second bit line with each other as hereinabove described, to be capable of feeding a rewrite current to the first and second bit lines through a single current path in writing. Thus, the memory device can rewrite data with smaller current consumption as compared with the case of feeding a rewrite current every bit line.

The aforementioned memory device according to the second aspect preferably further comprises a first latch circuit for storing write data for the first bit line and a second latch circuit for storing write data for the second bit line, and connects the current path of the first bit line and the current path of the second bit line with each other on the basis of outputs from the first latch circuit and the second latch circuit. According to this structure, the memory device can easily connect the current paths of the first and second bit lines with each other through the first and second latch circuits.

In this case, the current path control circuit preferably includes a logic circuit operating on the basis of the outputs from the first latch circuit and the second latch circuit and a switching element on-off controlled on the basis of an output from the logic circuit. According to this structure, the memory device can easily connect the current paths of the first and second bit lines by on-off controlling the switching element. In this case, further, a write enable signal line may be connected to an input terminal of the logic circuit. According to this structure, the memory device can easily control the output of the logic circuit through the write enable signal line.

In the aforementioned memory device according to the second aspect, a memory cell including a storage element exhibiting a magnetoresistance effect is preferably connected to at least the first bit line and the second bit line. According to this structure, the memory device can write data in the memory cell including the storage element exhibiting a magnetoresistance effect by feeding a current to the first and second bit lines. In this case, the storage element exhibiting a magnetoresistance effect may include a TMR element exhibiting a ferromagnetic tunnel effect.

The aforementioned memory device having the memory cell including the storage element exhibiting a magnetoresistance effect preferably further comprises a plurality of word lines arranged to intersect with the first bit line, the first pair line, the second bit line and the second pair line and a plurality of auxiliary word lines provided in correspondence to the word lines respectively and connected with the memory cell, and performs a data write operation by feeding mutually intersecting currents to one of the auxiliary word lines and the first and second bit lines. According to this structure, the memory device can write data in the memory cell located on the intersection between the auxiliary word line and the first and second bit lines through a composite field of a magnetic field formed by the current flowing through the auxiliary word line and a magnetic field formed by the current flowing through the first and second bit lines.

The aforementioned memory device having the memory cell including the storage element exhibiting a magnetoresistance effect preferably connects the current path of the first bit line and the current path of the second bit line with each other so that currents oppositely flow through the first bit line and the second bit line when data written in a memory cell connected to the first bit line and a memory cell connected to the second bit line are different from each other. According to this structure, the memory device can easily write different data in the memory cells including the storage elements exhibiting a magnetoresistance effect. In this case, currents may oppositely flow through the first bit line and the first pair line, and currents may oppositely flow through the second bit line and the second pair line.

In the aforementioned memory device according to the second aspect, the first pair line preferably includes a first inverted bit line paired with the first bit line and supplied with a signal level complementary to the first bit line, and the second pair line preferably includes a second inverted bit line paired with the second bit line and supplied with a signal level complementary to the second bit line. According to this structure, the memory device can write data, reverse to those in memory cells connected with the first and second bit lines, in memory cells connected with the first and second inverted bit lines respectively by connecting the memory cells to the first and second inverted bit lines. In this case, a memory cell is preferably connected to the first bit line and the first inverted bit line, and another memory cell is preferably connected to the second bit line and the second inverted bit line.

In this case, each of the memory cells connected to the first bit line and the first inverted bit line and to the second bit line and the second inverted bit line may include two storage elements having a magnetoresistance effect and two transistors. Thus, the memory device can write data corresponding to the first and second bit lines in the first storage element of each memory cell while writing data corresponding to the first and second inverted bit lines in the second storage element.

In this case, the memory device preferably further comprises a first latch circuit for storing write data for the first bit line and a second latch circuit for storing write data for the second bit line, while the first and second latch circuits preferably include sense amplifiers. According to this structure, the memory device can use the first and second latch circuits also as sense amplifiers for determining read data in data reading.

In the aforementioned memory device according to the second aspect, the first pair line may include a first auxiliary bit line paired with the first bit line and connected with no memory cell, and the second pair line may include a second auxiliary bit line paired with the second bit line and connected with no memory cell. According to this structure, the memory device can easily connect the current paths of the first and second bit lines with each other through the first and second auxiliary bit lines. In this case, each of memory cells connected to the first bit line and to the second bit line may include a storage element having a magnetoresistance effect and a transistor. Further, the storage element exhibiting a magnetoresistance effect may include a TMR element exhibiting a ferromagnetic tunnel effect.

The aforementioned memory device including the first and second auxiliary bit lines preferably further comprises a reference bit line and an auxiliary reference bit line, while a reference memory cell including a resistance element and a transistor is preferably connected to the reference bit line. According to this structure, the memory device can easily determine data stored in the memory cell on the basis of resistance resulting from the resistance element of the reference memory cell and resistance resulting from the storage element of the memory cell exhibiting a magnetoresistance effect.

In this case, the memory device further comprises a first latch circuit for storing write data for the first bit line, a second latch circuit for storing write data for the second bit line and a sense amplifier connected with at least the reference bit line and provided independently of the first latch circuit and the second latch circuit. According to this structure, the memory device can store data to be written in the memory cell through the first and second latch circuits while determining the data written in the memory cell through the sense amplifier.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
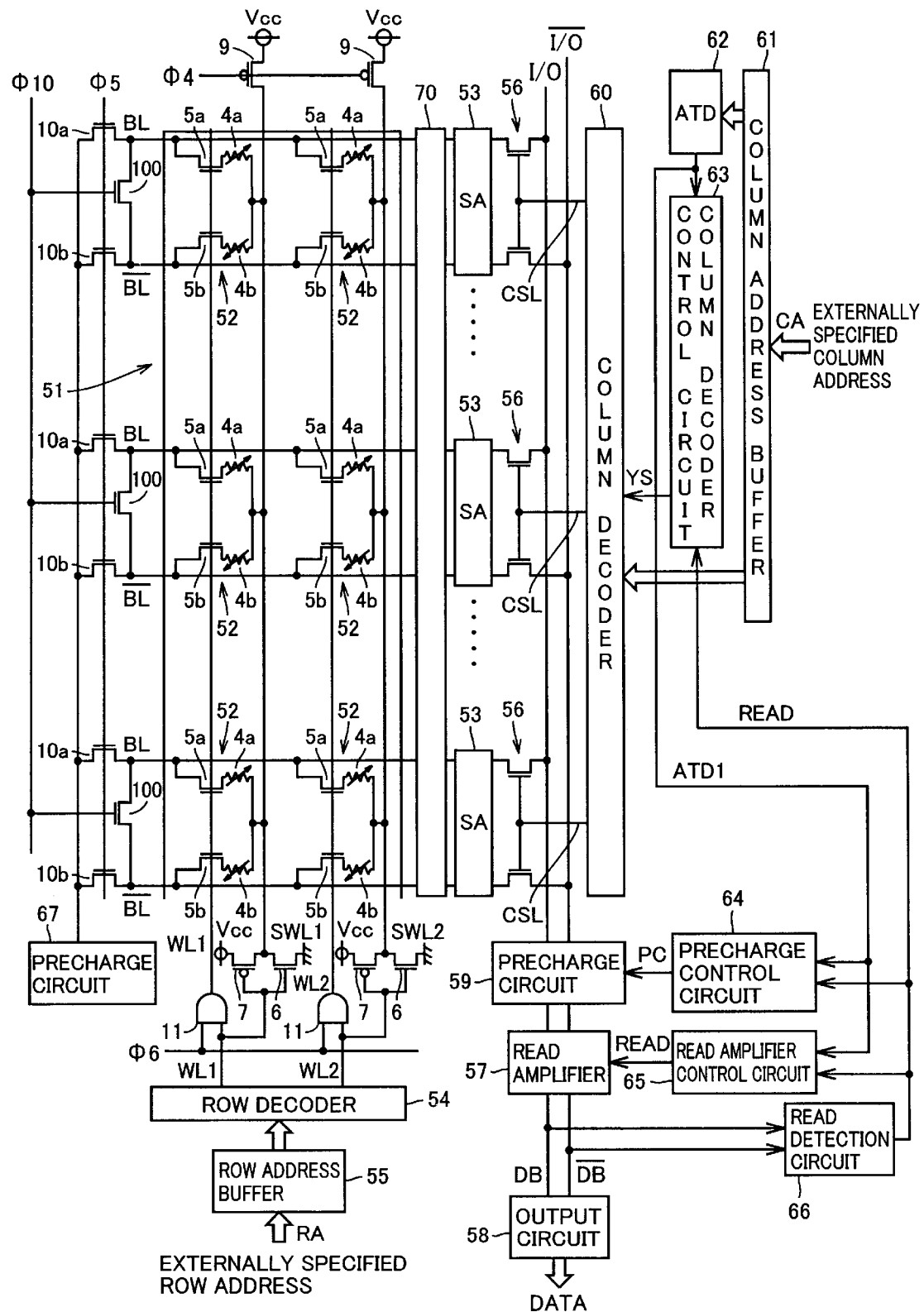
FIG. 1 is a block diagram showing the overall structure of an MRAM according to a first embodiment of the present invention.

Embodiments of the present invention are now described with reference to the drawings.

(First Embodiment)

The overall structure of an MRAM according to a first embodiment of the present invention is described with reference to FIGS. 1 and 2. The MRAM according to the first embodiment is mainly formed by a memory cell array 51 in the form of a matrix. The memory cell array 51 is formed by memory cells 52 arranged in row and column directions. Each memory cell 52 stores 1-bit data, which is the minimum unit of storage.

In the MRAM according to the first embodiment, each memory cell 52 is formed by two TMR elements 4a and 4b and two NMOS transistors 5a and 5b. As shown in FIG. 2, the TMR element 4a includes a ferromagnetic layer 3a, an insulating barrier layer 2a and another ferromagnetic layer 1a harder to invert than the ferromagnetic layer 3a. The TMR element 4b includes a ferromagnetic layer 3b, an insulating barrier layer 2b and another ferromagnetic layer 1b harder to invert than the ferromagnetic layer 3b. A word line WL is connected to the gates of the two NMOS transistors 5a and 5b.

In the memory cell array 51, each memory cell 52 arranged in the row direction (vertical direction in FIG. 1) is connected to a word line WL and an auxiliary word line SWL. Each memory cell 52 arranged in the column direction (horizontal direction in FIG. 1) is connected to a bit line BL and an inverted bit line /BL, which forms a pair of bit lines BL and /BL with the corresponding bit line BL. The inverted bit line /BL is an example of the "pair line" in the present invention.

Each pair of bit lines BL and /BL are connected to a cross-coupled latch sense amplifier (SA) 53. The signal levels of the bit line BL and the inverted bit line /BL forming each pair of bit lines BL and /BL complementarily change.

Figure 3:
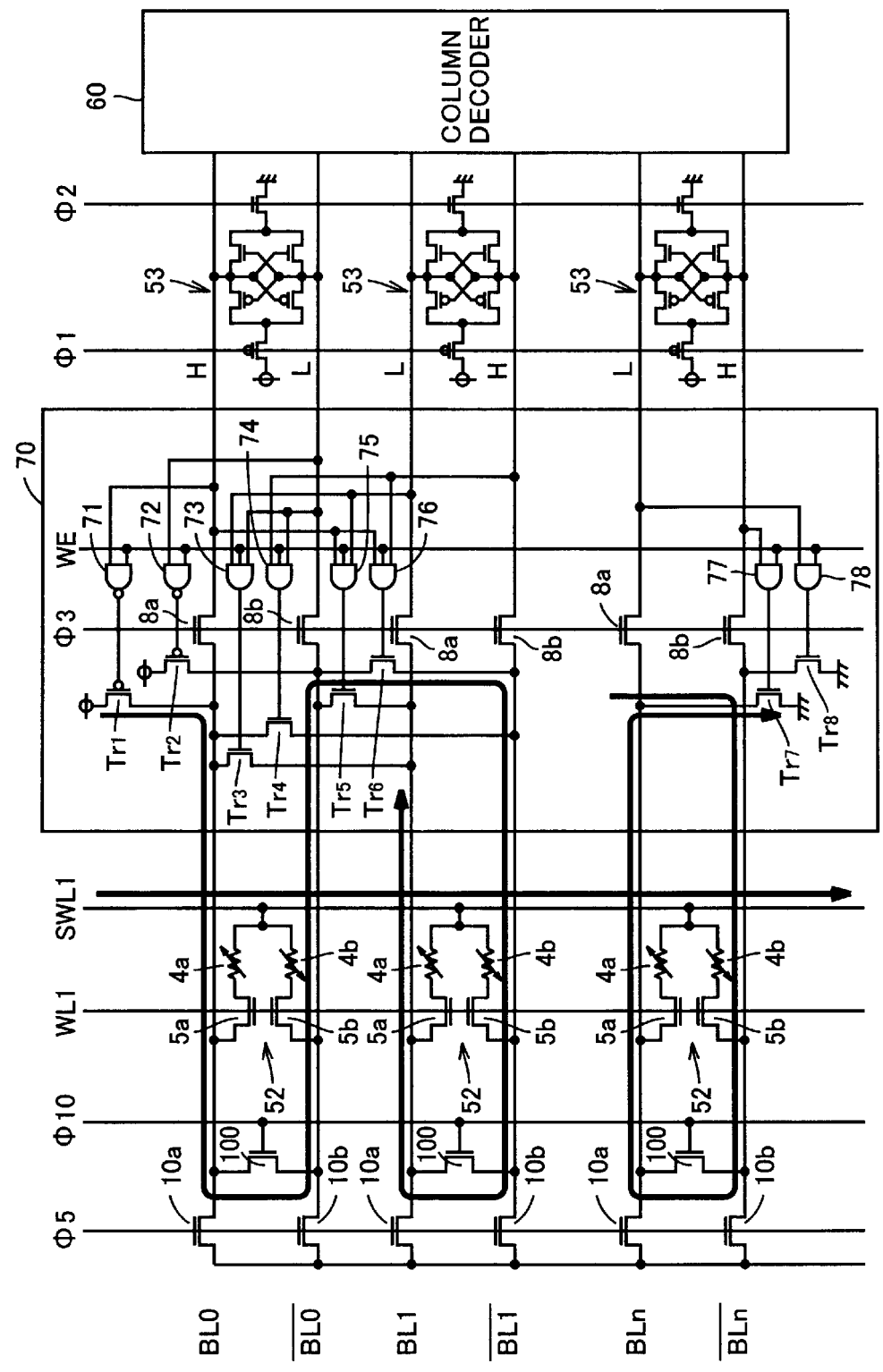
FIG. 3 is a circuit diagram showing a memory cell array part and a current path control circuit part of the MRAM according to the first embodiment shown in FIGS. 1 and 2.

In the MRAM according to the first embodiment, a current path control circuit 70 is provided between the pairs of bit lines BL and /BL and the sense amplifiers (SA) 53 for connecting current paths of the bit lines BL with each other in data writing. As shown in FIG. 3, the current path control circuit 70 includes NAND circuits 71 and 72, AND circuits 73 to 78, switching transistors Tr1 and Tr2 consisting of PMOS transistors, switching transistors Tr3 to Tr8 consisting of NMOS transistors and NMOS transistors 8a and 8b. The NAND circuits 71 and 72 and the AND circuits 73 to 78 are examples of the "logic circuit" in the present invention. The switching transistors Tr1 to Tr8 are examples of the "switching element" in the present invention.

The NMOS transistors 8a and 8b are provided in order to separate each pair of bit lines BL and /BL from the sense amplifier (SA) 53. A signal line Φ3 is connected to the gates of the NMOS transistors 8a and 8b.

Outputs of the NAND circuits 71 and 72 are connected to the gates of the switching transistors Tr1 and Tr2 consisting of PMOS transistors respectively. Outputs of the AND circuits 73 to 78 are connected to the gates of the switching transistors Tr3 to Tr8 consisting of NMOS transistors respectively. Therefore, the switching transistors Tr1 and Tr2 consisting of PMOS transistors are turned on when the outputs of the NAND circuits 71 and 72 are low. Further, the switching transistors Tr3 to Tr8 consisting of NMOS transistors are turned on when the outputs of the AND circuits 73 to 78 are high.

A first source/drain of the switching transistor Tr1 is connected to a driving voltage Vcc, and a second source/drain thereof is connected to a bit line BL0. A first source/drain of the switching transistor Tr2 is connected to the driving voltage Vcc, and a second source/drain thereof is connected to an inverted bit line /BL0.

A first source/drain of the switching transistor Tr3 is connected to the bit line BL0, and a second source/drain thereof is connected to a bit line BL1. A first source/drain of the switching transistor Tr4 is connected to the bit line BL0, and a second source/drain thereof is connected to an inverted bit line /BL1. A first source/drain of the switching transistor Tr5 is connected to the inverted bit line /BL0, and a second source/drain thereof is connected to the bit line BL1. A first source/drain of the switching transistor Tr6 is connected to the inverted bit line /BL0, and a second source/drain thereof is connected to the inverted bit line /BL1. Such switching transistors Tr3 to Tr6 and AND circuits 73 to 76 are similarly provided also for bit lines BL2, BL3, . . . (not shown).

A first source/drain of the switching transistor Tr7 is connected to a bit line BLn, and a second source/drain thereof is grounded. A first source/drain of the switching transistor Tr8 is connected to an inverted bit line /BLn, and a second source/drain thereof is grounded.

A write enable signal line WE is connected to first input terminals of the NAND circuits 71 and 72, second input terminals of the AND circuits 73 to 76 and first input terminals of the AND circuits 77 and 78 respectively.

Second input terminals of the NAND circuits 71 and 72 are connected to the bit line BL0 and the inverted bit line /BL0 respectively. A first input terminal of the AND circuit 73 is connected to the bit line BL1 and a third input terminal of the AND circuit 75. A third input terminal of the AND circuit 73 is connected to the inverted bit line /BL0 and a third input terminal of the AND circuit 74. A first input terminal of the AND circuit 74 is connected to the inverted bit line /BL1 and a third input terminal of the AND circuit 76. A first input terminal of the AND circuit 75 is connected to the bit line BL0 and a first input terminal of the AND circuit 76. A third input terminal of the AND circuit 76 is connected to the inverted bit line /BL1 and the first input terminal of the AND circuit 74.

A second input terminal of the AND circuit 77 is connected to the inverted bit line /BLn. A second input terminal of the AND circuit 78 is connected to the bit line BLn.

Figure 2:
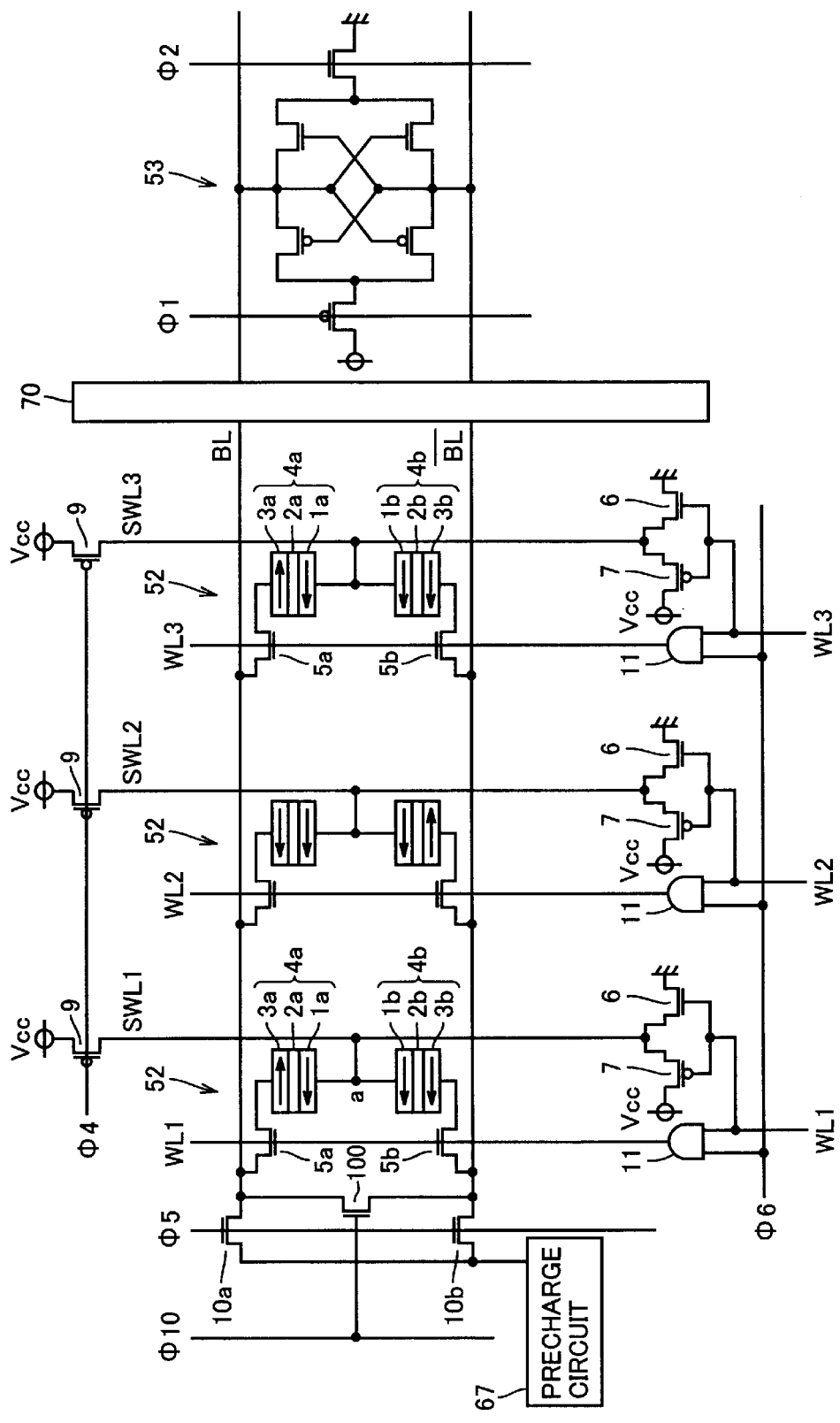
FIG. 2 is a circuit diagram showing the structure of a memory cell part of the MRAM according to the first embodiment shown in FIG. 1.

As shown in FIG. 1, the word lines WL are connected to a row decoder 54. A row address buffer 55 supplies an externally specified row address RA to the row decoder 54. Thus, the row decoder 54 selects the word line WL corresponding to the row address RA.

A first end of the auxiliary word line SWL is connected to each word line WL through an inverter circuit including an NMOS transistor 6 and a PMOS transistor 7. The driving voltage Vcc is connected to a second end of the auxiliary word line SWL through a PMOS transistor 9. A signal line Φ4 is connected to the gate of the PMOS transistor 9.

The word line WL is connected to a first input terminal and an output terminal of an AND circuit 11. A signal line Φ6 regularly reaching zero (low) in writing is connected to a second input terminal of the AND circuit 11.

NMOS transistors 10a and 10b are connected to the bit line BL and the inverted bit line /BL respectively. A signal line Φ5 is connected to the gates of the NMOS transistors 10a and 10b. First ends of the NMOS transistors 10a and 10b are interconnected. A precharge circuit 67 is connected to the interconnected NMOS transistors 10a and 10b.

An NMOS transistor 100 is arranged between the bit line BL and the inverted bit line /BL for connecting the bit line BL and the inverted bit line /BL with each other. A signal line Φ10 is connected to the gate of the NMOS transistor 100.

The sense amplifiers 53 are connected to an input/output line I/O and an inverted input/output line /I/O through the transfer gates 56. The input/output line I/O and the inverted input/output line /I/O form a pair of input/output lines I/O and /I/O. The pair of input/output lines I/O and /I/O are connected to a read amplifier 57. The read amplifier 57 is connected to an output circuit 58 for data through a data bus DB and an inverted data bus /DB. The data bus DB and the inverted data bus /DB form a pair of data buses DB and /DB. A precharge circuit 59 is connected to the pair of input/output lines I/O and /I/O.

The levels of the input/output line I/O and the inverted input/output line /I/O complementarily change. The levels of the data bus DB and the inverted data bus /DB also complementarily change. The output circuit 58 outputs data.

The transfer gates 56 are connected to a column decoder 60 through column selection lines CSL. Each transfer gate 56 is formed by a pair of NMOS transistors connected between the pair of input/output lines I/O and /I/O and the sense amplifier 53. The gates of the pair of NMOS transistors are connected to the column decoder 60 through a single column selection line CSL. When the column selection line CSL goes high, therefore, the pair of NMOS transistors are turned on to turn on the transfer gate 56. FIG. 3 illustrates no transfer gates 56, no pair of input/output lines I/O and /I/O and no column selection lines CSL, in order to simplify the illustration.

A column address buffer 61 supplies an externally specified column address CA to the column decoder 60 and an address transition detector (hereinafter abbreviated as "ATD") 62.

The ATD 62 detects external specification of the column address CA by detecting change of the column address CA, and generates a pulse signal ATD1. In other words, the ATD 62 generates the pulse signal ATD1 every change of the column address CA. The ATD 62 outputs the pulse signal ATD1 to a column decoder control circuit 63, a precharge control circuit 64 and a read amplifier control circuit 65.

The precharge control circuit 64 generates a 1-pulse precharge circuit activation signal PC going high for a predetermined time on the basis of the pulse signal ATD1 falling from a high level to a low level, and outputs the activation signal PC to the precharge circuit 59.

When activated, the precharge circuit 59 performs precharging of setting the pair of input/output lines I/O and /I/O to the same potential of a prescribed level ½Vcc, for example (Vcc: driving voltage for the MRAM).

When receiving the activation signal PC, the precharge circuit 59 is inactivated (enters an activation standby state) and stops precharging the pair of input/output lines I/O and /I/O. The column decoder control circuit 63 generates a 1-pulse column decoder activation signal YS going high for a predetermined time on the basis of the pulse signal ATD1 falling from a high level to a low level, and outputs the activation signal YS to the column decoder 60.

When receiving the activation signal YS, the column decoder 60 is activated to select a column (a pair of bit lines BL and /BL) of the memory cell array 51 corresponding to the externally specified column address CA. In other words, the column decoder 60 is activated when receiving the activation signal YS. When activated, the column decoder 60 selects the column selection line CSL corresponding to the externally specified column address CA and sets the column selection line CS high. Thus, the transfer gate 56 connected to the column selection line CSL is turned on. Therefore, the column of the memory cell array 51 corresponding to the externally specified column address CA is selected through the sense amplifier 53 corresponding to the transfer gate 56.

The read amplifier control circuit 65 generates a 1-pulse read amplifier activation signal READ obtained by delaying the pulse signal ATD1 by a prescribed time on the basis of the pulse signal ATD1 falling from a high level to a low level. The timing and the pulse width of the activation signal READ are previously set. The activation signal READ is output to the read amplifier 57.

The delay time of the activation signal READ corresponds to a time required for developing sufficient potential difference between the pair of input/output lines I/O and /I/O for reading data. In other words, the delay time is set to a time for waiting until the potentials of the pair of input/output lines I/O and /I/O change from the precharged level to levels exhibiting sufficient potential difference for preventing the read amplifier 57 from false reading.

That is, the control circuits 63 to 65 serve as delay circuits and pulse generation circuits generating the activation signals YS, PC and READ at proper timing with proper pulse widths when the pulse signal ATD1 falls from a high level to a low level.

The MRAM is further provided with a read detection circuit 66 detecting potential difference between the pair of data buses DB and /DB and generating a high-level read detection signal READ on the basis of the result of the detection. Thus, data read from any memory cell 52 is defined and output when the potential difference between the pair of data buses DB and /DB exceeds a prescribed level. Thus, a data output (read operation) can be detected by detecting the potential difference between the pair of data buses DB and /DB. The read detection circuit 66 detects the read operation on the basis of the potential difference between the pair of data buses DB and /DB while generating the high-level read detection signal READ on the basis of the result of the detection. The read detection circuit 66 outputs the detection signal READ to the column decoder control circuit 63, the precharge control circuit 64 and the read amplifier 65.

Write and read operations of the MRAM according to the first embodiment having the aforementioned structure are now described.

(Write Operation)

An operation of writing data in the memory cells 52 connected to the word line WL1 is described. As shown in FIG. 3, the MRAM stores write data in the latch sense amplifiers 53. In this case, the bit lines BL0, BL1 and BLn store high, low and low levels respectively.

In order to write the data, the MRAM sets the signal line Φ6 (FIG. 2) low. Thus, a low-level signal is input in the second input terminal of the AND circuit 11. In this case, the word line WL1 input in the first input terminal of the AND circuit 11 is high due to the selection by the row decoder 54. Therefore, a part output from the AND circuit 11 for the selected word line WL1 goes low. Thus, the MRAM sets the signal line Φ6 low thereby forcibly setting the word line WL1 connected to the output of the AND circuit 11 low.

Thus, the NMOS transistors 5a and 5b connected to the word line WL1 connected to the output terminal of the AND circuit 11 are turned off. The signal line Φ4 falls to a low level thereby turning on the PMOS transistor 9. In this case, the word line WL1 connected to an auxiliary word line SWL1 through an inverter is high and hence the NMOS transistor 6 forming the inverter is turned on. Thus, the lower potion of the auxiliary word line SWL1 reaches a ground potential GND. As to the upper portion of the auxiliary word line SWL1, the PMOS transistor 9 is turned on to reach the driving voltage Vcc due to fall of the signal line Φ4, and hence a current downwardly flows through the auxiliary word line SWL1.

As shown in FIG. 3, the bit lines BL0, BL1 and BLn are high, low and low respectively, whereby the inverted bit lines /BL0, /BL1 and /BLn go low, high and high respectively. In this case, the first input terminals of the NAND circuits 71 and 72 go high and low respectively. In this state, the MRAM sets the write enable signal line WE high while setting the signal line Φ3 low. Thus, outputs of the NAND circuits 71 and 72 go low and high respectively, thereby turning the switching transistors Tr1 and Tr2 on and off respectively.

Further, an output of the AND circuit 76 goes high, thereby turning on the switching transistor Tr6. Thus, the inverted bit lines /BL0 and /BL1 are connected with each other thereby connecting current paths of the pairs of bit lines BL0 and /BL0 and BL1 and /BL1. Outputs of the AND circuits 73 to 75 go low, thereby turning off the switching transistors Tr3 to Tr5. The MRAM similarly connects current paths of the bit lines BL2, BL3, . . . (not shown) through the switching transistors Tr3 to Tr6 and the AND circuits 73 to 76.

Outputs of the AND circuits 77 and 78 go high and low respectively, thereby turning the switching transistors Tr7 and Tr8 on and off respectively. The signal line Φ10 goes high, and the NMOS transistor 100 is turned on.

The current paths of the bit lines BL0, BL1, . . . BLn are connected with each other due to the aforementioned on-off states of the switching transistors Tr1 to Tr8, whereby a current uninterruptedly flows through the bit lines BL0, BL1, . . . BLn as shown by wide lines in FIG. 3. In other words, the current path control circuit 70 connects the current paths of the bit lines BL0, BL1, . . . BLn with each other, whereby a write current can be fed to the bit lines BL0, BL1, . . . BLn through a single current path. Thus, data are rewritten in all memory cells 52 intersecting with the selected auxiliary word line SWL1 due to a composite magnetic field of those resulting from a current flowing through the auxiliary word line SWL1 and the directions of the current flowing through the respective bit lines BL0, BL1, . . . BLn. The current oppositely flows through each pair of bit lines BL and /BL.

According to the first embodiment, the MRAM can feed a rewrite current through a single current path by connecting the current paths of the bit lines BL0, BL1, . . . BLn through the current path control circuit 70 in data writing, whereby the data can be rewritten with smaller current consumption as compared with a case of feeding a rewrite current every bit line.

As hereinabove described, further, the MRAM can easily write reverse data (e.g., "1" and "0") in the ferromagnetic layers 3a and 3b of the TMR elements 4a and 4b of the selected memory cells 52 by downwardly feeding the current to the auxiliary word line SWL1 while feeding the current oppositely to each pair of bit lines BL and /BL.

In order to write data (e.g., "0" and "1") reverse to the above in the ferromagnetic layers 3a and 3b of the TMR elements 4a and 4b, the MRAM may feed the current to each pair of bit lines BL and /BL oppositely to the above.

(Read Operation)

As hereinabove described, the MRAM writes data forming reverse magnetic fields in the ferromagnetic layers 3a and 3b of the TMR elements 4a and 4b connected to each bit line BL and each inverted bit line /BL respectively in the data write operation. The read operation is now described with reference to FIGS. 2 and 4 with respect to a case of selecting the memory cells 52 connected to the word line WL1.

Before rising, the word line WL1 (FIG. 2) is low. In this case, the PMOS transistor 7 of the inverter circuit connected to the word line WL1 is turned on, whereby the potential of the auxiliary word line SWL1 reaches the driving voltage Vcc. Thus, the potentials of nodes a also reach the driving voltage Vcc. The potentials of the TMR elements 4a and 4b formed by conductors also reach the driving potential Vcc. In this state, the signal line Φ5 goes high while the precharge circuit 67 precharges each bit line BL and each inverted bit line /BL to the driving voltage Vcc. Upon rising, the word line WL1 is set high by the row decoder 54 thereby turning on the NMOS transistors 5a and 5b connected thereto. Thus, each bit line BL and each inverted bit line /BL and the TMR elements 4a and 4b are rendered conductive. In this case, the potentials of the bit line BL, the inverted bit line /BL and each node a are at the driving voltage Vcc.

When the word line WL1 rises high, the signal line Φ5 goes low and the precharge circuit 67 is cut off while the NMOS transistor 6 of the inverted circuit connected to the word line WL1 is turned on, whereby the potential of the auxiliary word line SWL1 is gradually lowered toward the ground potential GND. Thus, the potential of the node a is also gradually lowered toward the ground potential GND. Therefore, the potentials of the bit line BL and the inverted bit line /BL are also gradually lowered toward the ground potential GND. The TMR element 4a connected to the bit line BL is slightly higher in resistance than the TMR element 4b connected to the inverted bit line /BL since the directions of the magnetic fields are opposite in the ferromagnetic layers 3a and 1a.

When the MRAM starts lowering the potentials of the bit line BL and the inverted bit line /BL toward the ground potential GND, the MR ratio (resistance change) is maximized due to slight potential difference between the bit line BL and the inverted bit line /BL and the node a.

Figure 4:
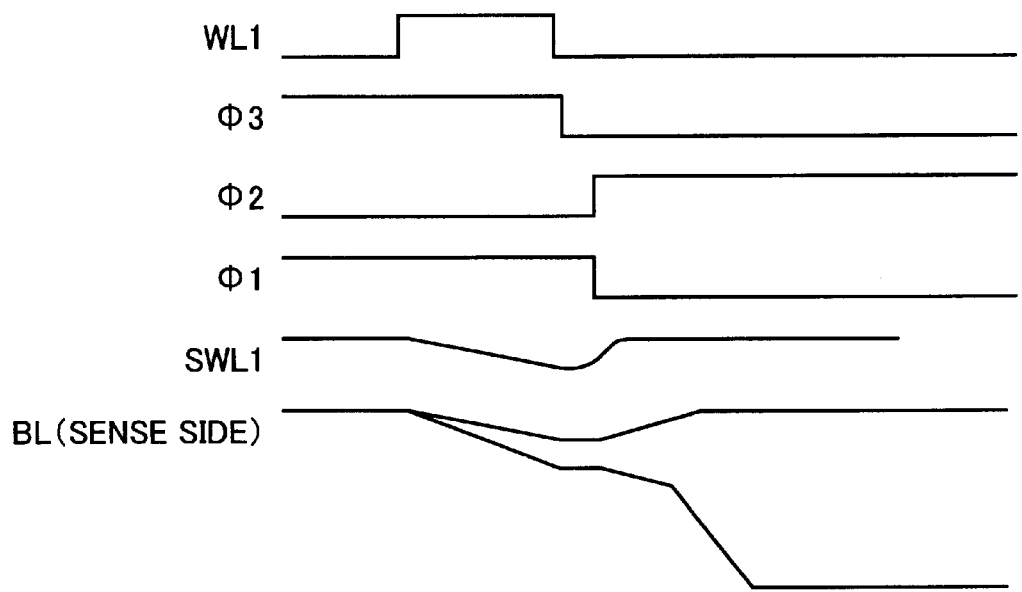
FIG. 4 is an operation waveform diagram for illustrating a read operation of the MRAM according to the first embodiment shown in FIGS. 1 and 2.

The potentials of the bit line BL and the inverted bit line /BL also lower as the potential of the node a lowers. In this case, the potential of the TMR element 4a connected to the bit line BL lowers at a slower speed than that of the TMR element 4b connected to the inverted bit line /BL due to the slightly high resistance. Thus, potential difference is caused between the bit line BL and the inverted bit line /BL. The word line WL1 falls from a high level to a low level at the timing of the potential difference, as shown in FIG. 4.

The word line WL1 falls before the potential of the node a reaches the ground potential GND for the following reason: The potential difference between the bit line BL and the inverted bit line /BL is caused only in a transient state. When the potentials (potential the of node a) of the ferromagnetic layers 1a and 1b of the TMR elements 4a and 4b reach the ground potential GND, therefore, the potentials of the bit line BL and the inverted bit line /BL connected with the ferromagnetic layers 3a and 3b respectively also reach the ground potential GND. In this case, no detectable potential difference is caused between the bit line BL and the inverted bit line /BL.

While potential difference is caused between the bit line BL and the inverted bit line /BL at transient timing, the TMR elements 4a and 4b are formed by conductors and hence the potentials of the bit line BL and the inverted bit line /BL finally reach the same level. Therefore, the signal line Φ3 (see FIG. 3) falls in response to the fall timing of the word line WL1. Thus, the NMOS transistors (separation transistors) 8a and 8b are turned off, thereby separating the bit line BL and the inverted bit line /BL from the sense amplifier 53. Thereafter the signal lines Φ1 and Φ2 for the sense amplifier 53 rise thereby activating the sense amplifier 53. Thus, the potential difference between the bit line BL and the inverted bit line /BL is so amplified that the potentials of the bit line BL and the inverted bit line /BL reach the driving voltage Vcc and the ground potential GND respectively. Thus, the MRAM reads data.

The signal line Φ5 rises and the precharge circuit 67 is turned on at the fall timing of the signal line Φ3 for precharging the bit line BL and the inverted bit line /BL to the driving voltage Vcc.

(Second Embodiment)

Figure 5:
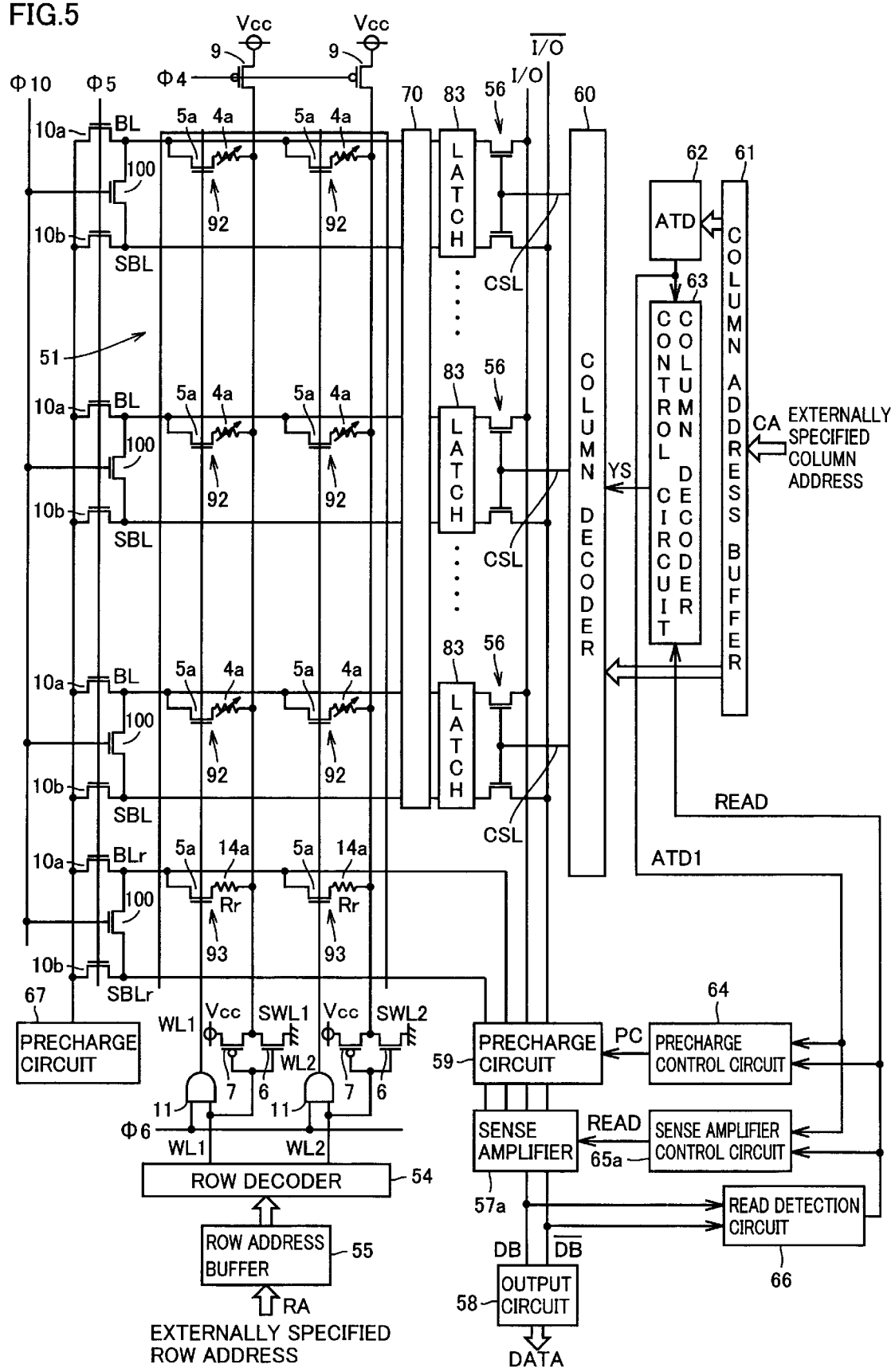
FIG. 5 is a block diagram showing the overall structure of an MRAM according to a second embodiment of the present invention.
Figure 6:
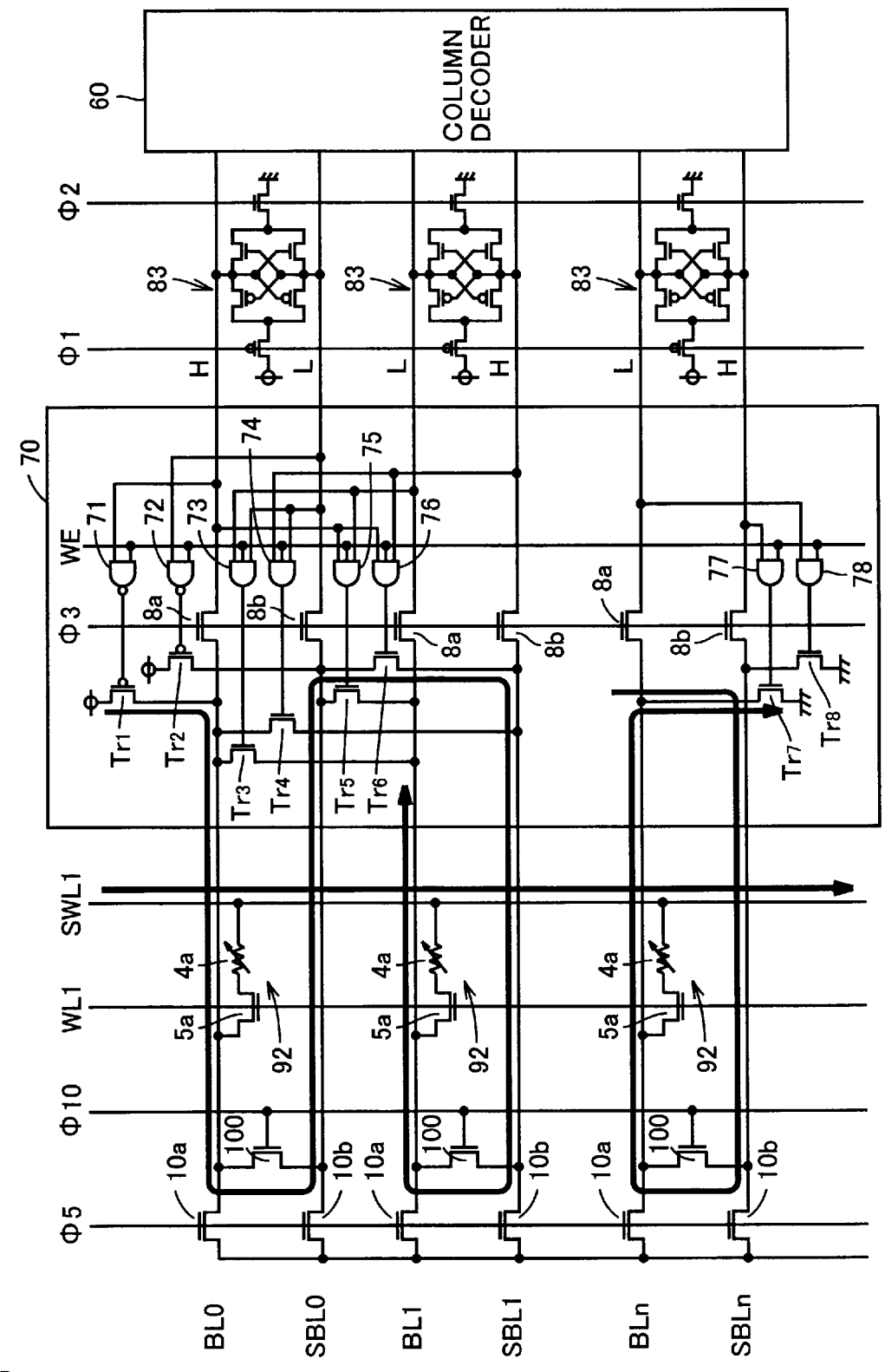
FIG. 6 is a circuit diagram showing a memory cell array part and a current path control circuit part of the MRAM according to the second embodiment shown in FIG. 5.
Figure 7:
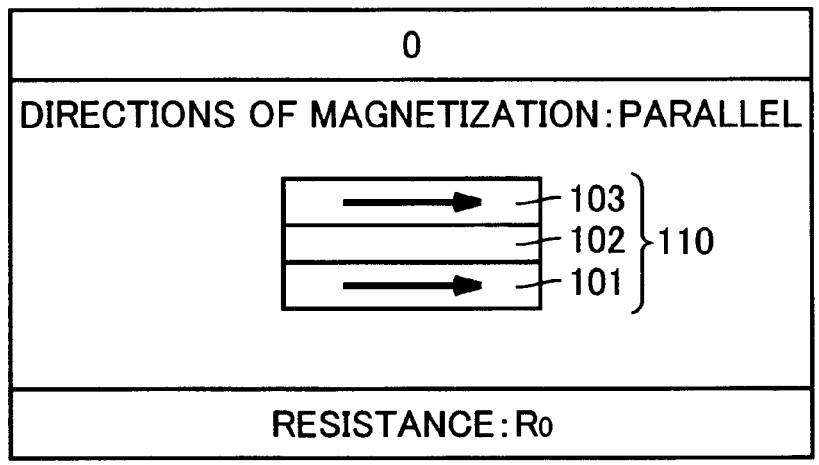
FIGS. 7 and 8 are schematic diagrams for illustrating the structure of a storage element of a conventional MRAM.
Figure 8:
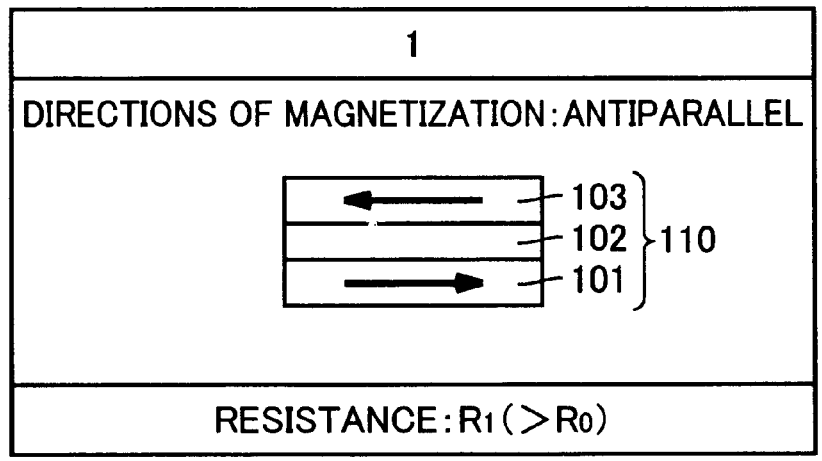
Figure 9:
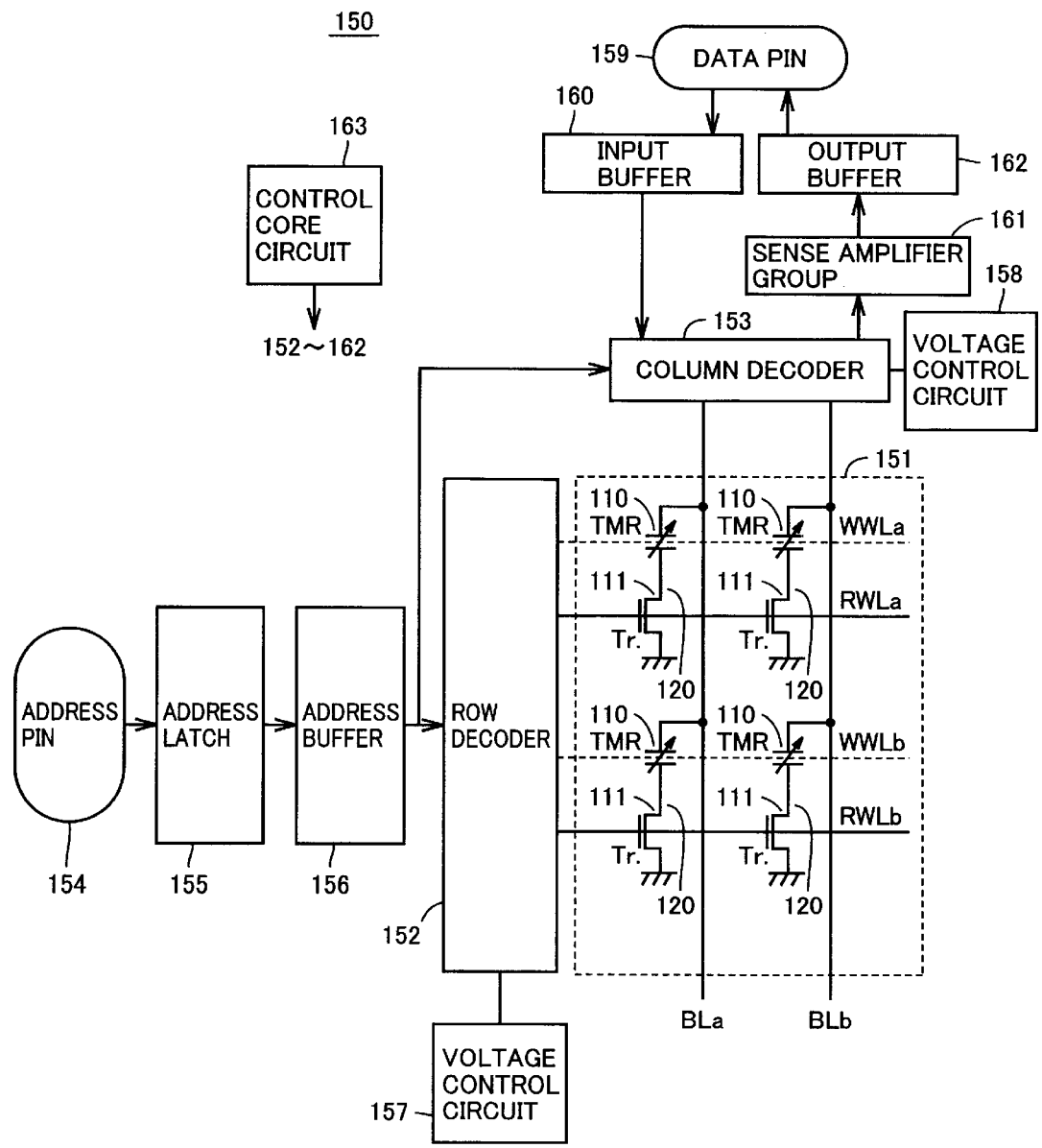
FIG. 9 is a block diagram showing the overall structure of another conventional MRAM.

Referring to FIGS. 5 and 6 showing an MRAM according to a second embodiment of the present invention, each memory cell is formed by a transistor and a TMR element, dissimilarly to the aforementioned first embodiment.

According to the second embodiment, each memory cell 92 is formed by a transistor 5a and a TMR element 4a, as shown in FIG. 5. The MRAM according to the second embodiment is provided with an auxiliary bit line SBL corresponding to each bit line BL. The auxiliary bit line SBL is an example of the "pair line" in the present invention. The auxiliary bit line SBL consists or a mere wire.

According to the second embodiment, latches 83 are provided between a current path control circuit 70 and a column decoder 60. The latches 83, having a function of holding write data received from the column decoder 60, are similar in circuit structure to the sense amplifiers 53 according to the first embodiment shown in FIG. 3. The latches 83 are examples of the "latch circuit" in the present invention.

The MRAM according to the second embodiment is further provided with a reference bit line BLr and an auxiliary reference bit line SBLr. The reference bit line BLr includes a reference memory cell 93 consisting of a resistance element 14a and an NMOS transistor 5a every word line WL. The resistance element 14a of the reference memory cell 93 has an intermediate resistance value Rr between resistance values of the TMR element 4a exhibited when the directions of magnetization are parallel and antiparallel respectively. The reference bit line BLr and the auxiliary reference bit line SBLr are connected to a sense amplifier 57a through a precharge circuit 59. According to the second embodiment, a sense amplifier control-circuit 65a is connected to the sense amplifier 57a. An input/output line I/O and an inverted input/output line /I/O are also connected to the sense amplifier 57a through the precharge circuit 59.

The current path control circuit 70 according to the second embodiment is similar in internal structure to the current path control circuit 70 according to the first embodiment shown in FIG. 3. The remaining structure of the MRAM according to the second embodiment is also similar to that of the MRAM according to the first embodiment.

The MRAM according to the second embodiment is provided with the auxiliary bit line SBL paired with each bit line BL as hereinabove described. Also when each memory cell 92 is formed by the single transistor 5a and the single TMR element 4a, therefore, the current path control circuit 70 can connect current paths of the bit lines BL with each other, whereby the MRAM can feed a rewrite current to the bit lines BL through a single current path. Thus, the MRAM can rewrite data with smaller current consumption as compared with a case of feeding a rewrite current every bit line.

(Write Operation)

A write operation (rewrite operation) of the MRAM according to the second embodiment is similar to that of the aforementioned MRAM according to the first embodiment. In the write operation, the MRAM operates the column decoder 60 for storing write data in the latches 83, as shown in FIG. 6. The write operation is described with respect to a case of storing high, low and low levels in bit lines BL0, BL1 and BLn respectively.

The MRAM downwardly feeds current to an auxiliary word line SWL1 by a method similar to that in the first embodiment.

The bit lines BL0 BL1 and BLn are high, low and low respectively as shown in FIG. 6, and hence inverted bit lines /BL0, /BL1 and /BLn go low, high and high respectively. In this case, switching transistors Tr1 and Tr2 are turned on and off respectively. Further, switching transistors Tr6 are turned on and switching transistors Tr3 to Tr5 are turned off respectively. In addition, switching transistors Tr7 and Tr8 are turned on and off respectively.

Current paths of the bit lines BL0, BL1, . . . BLn are connected with each other due to the aforementioned on-off states of the switching transistors Tr1 to Tr8, whereby a current uninterruptedly flows through the bit lines BL0, BL1, . . . BLn as shown by wide lines in FIG. 6. In other words, the current path control circuit 70 connects the current paths of the bit lines BL0, BL1, . . . BLn with each other, whereby a write current can be fed to the bit lines BL0, BL1, . . . BLn through a single current path. Thus, data are rewritten in all memory cells 52 intersecting with the selected auxiliary word line SWL1 due to a composite magnetic field of those resulting from a current flowing through the auxiliary word line SWL1 and the directions of the current flowing through the respective bit lines BL0, BL1, . . . BLn. The current oppositely flows through each pair of bit lines BL and /BL.

(Read Operation)

A read operation is now described with reference to FIGS. 5 and 6 as to a case of selecting a memory cell 92 connected with the word line WL1 and a bit line BL2.

In an initial state, the potentials of each bit line BL, each auxiliary word line SWL, the input/output line I/O and the reference bit line BLr are at a driving voltage Vcc (high). Thereafter each bit line BL and each auxiliary word line SWL enter floating states of the voltage Vcc. When an address is input in a row decoder 54 and a signal line Φ6 is activated high, an output of an AND circuit 11 goes high and hence the selected word line WL1 goes high. When the selected word line WL1 input in the AND circuit 11 goes high, an NMOS transistor 6 connected to an auxiliary word line SWL1 corresponding to the selected word line WL1 is turned on. Thus, the potential of the auxiliary word line SWL1 in the floating state of the voltage Vcc gradually starts to lower from the voltage Vcc to a ground potential (Vss).

At this time, the bit line BL2 and the auxiliary bit line SBL are connected to the input/output line I/O and the inverted input/output line /I/O respectively due to an address input in the column decoder 60. The reference bit line BLr and the auxiliary reference bit line SBLr are connected to the precharge circuit 59. When the potential of the auxiliary word line SWL1 starts to lower from the voltage Vcc to the ground potential (Vss), the potentials of the bit line BL2 and the reference bit line BLr also start to lower from the voltage Vcc to the ground potential (Vss). Thus, the potentials of the input/output line I/O input in the sense amplifier 57a and the reference bit line BLr also start to lower from the voltage Vcc to the ground potential (Vss).

In this case, the resistance value of the TMR element 4a of the selected memory cell 52 is smaller than a resistance value Rr of the resistance element 14a of the reference bit line BLr assuming that the directions of magnetization are parallel. Therefore, the potentials of the input/output line I/O connected to the bit line BL2 and the reference bit line BLr lower from the voltage Vcc toward the ground potential (Vss) at different speeds. More specifically, the potential of the input/output line I/O connected with the bit line BL2 is to lower faster than that of the reference bit line BLr, to result in potential difference between the input/output line I/O connected with the bit line BL2 and the reference bit line BLr.

The MRAM detects this potential difference at proper timing, thereby activating the sense amplifier 57a. The MRAM amplifies the potential difference between the input/output line I/O connected with the bit line BL2 and the reference bit line BLr through the activated sense amplifier 57a, so that the input/output line I/O connected with the bit line BL2 and the reference bit line BLr go low and high respectively. The MRAM outputs a signal corresponding thereto from an output circuit 58.

When the selected memory cell 92 stores data having antiparallel directions of magnetization, the resistance value Rr of the resistance element 14a, connected with the reference bit line BLr is smaller than the resistance value of the TMR element 4a of the selected memory cell 52 and hence the potential of the reference bit line BLr is to lower faster than that of the input/output line I/O connected with the bit line BL2 contrarily to the above. When the MRAM amplifies the potential difference through the sense amplifier 57a, the input/output line I/O and the reference bit line BLr go high and low respectively.

The MRAM detects the potential difference between the input/output line I/O and the reference bit line BLr before the potentials of the bit line BL2 and the reference bit line BLr reach the ground potential GND for the following reason: While potential difference is caused between each bit line BL and the reference bit line BLr at transient timing, the TMR element 4a and the resistance element 14a are made of conductors and hence the potentials of the bit line BL and the reference bit line BLr finally reach the same level.

As hereinabove described, the MRAM according to the second embodiment can easily read data by forming each memory cell 52 by the single TMR element 4a and the single NMOS transistor 5a while detecting the potential difference between the bit line BL connected with the single TMR element 4a and the reference bit line BLr through the sense amplifier 57a.

Although the present invention has been described and illustrated in detail, it is clearly understood that the same is by way of illustration and example only and is not to be taken by way of limitation, the spirit and scope of the present invention being limited only by the terms of the appended claims.

For example, while the MRAM according to each of the aforementioned embodiments employs the TMR element(s) as the storage element(s) forming each memory cell, the present invention is not restricted to this but a storage element other than the TMR element is also employable so far as the same exhibits a ferromagnetic tunnel effect. Also when employing a storage element exhibiting a magnetoresistance effect other than the ferromagnetic tunnel effect, further, an effect similar to those of the aforementioned embodiments can be attained.

What is claimed is:

1. A memory device comprising:
   a first bit line; and
   a second bit line having a current path independently of said first bit line,
   wherein a write current path of said first bit line and a write current path of said second bit line are formed in a single common current path.

2. A memory device comprising:
   a first bit line;
   a first pair line paired with said first bit line;
   a second bit line;
   a second pair line paired with said second bit line; and
   a current path control circuit connecting one of said first bit line and said first pair line and one of either said second bit line and said second pair line with each other for data writing thereby connecting current paths of said first bit line and said second bit line with each other.

3. The memory device according to claim 2, further comprising:
   a first latch circuit for storing write data for said first bit line, and
   a second latch circuit for storing write data for said second bit line, and
   connecting said current path of said first bit line and said current path of said second bit line with each other on the basis of outputs from said first latch circuit and said second latch circuit.

4. The memory device according to claim 3, wherein said current path control circuit includes:
   a logic circuit operating on the basis of said outputs from said first latch circuit and said second latch circuit, and
   a switching element on-off controlled on the basis of an output from said logic circuit.

5. The memory device according to claim 4, wherein a write enable signal line is connected to an input terminal of said logic circuit.

6. The memory device according to claim 2, wherein a memory cell including a storage element exhibiting a magnetoresistance effect is connected to at least said first bit line and said second bit line.

7. The memory device according to claim 6, wherein said storage element exhibiting a magnetoresistance effect includes a TMR element exhibiting a ferromagnetic tunnel effect.

8. The memory device according to claim 6, further comprising:
   a plurality of word lines arranged to intersect with said first bit line, said first pair line, said second bit line and said second pair line, and
   a plurality of auxiliary word lines provided in correspondence to said word lines respectively and connected with said memory cell, and
   performing a data write operation by feeding mutually intersecting currents to one of said auxiliary word lines and said first and second bit lines.

9. The memory device according to claim 6, connecting said current path of said first bit line and said current path of said second bit line with each other so that currents oppositely flow through said first bit line and said second bit line when data written in a memory cell connected to said first bit line and a memory cell connected to said second bit line are different from each other.

10. The memory device according to claim 9, wherein currents oppositely flow through said first bit line and said first pair line, and currents oppositely flow through said second bit line and said second pair line.

11. The memory device according to claim 2, wherein said first pair line includes a first inverted bit line paired with said first bit line and supplied with a signal level complementary to said first bit line, and said second pair line includes a second inverted bit line paired with said second bit line and supplied with a signal level complementary to said second bit line.

12. The memory device according to claim 11, wherein a memory cell is connected to said first bit line and said first inverted bit line, and another memory cell is connected to said second bit line and said second inverted bit line.

13. The memory device according to claim 12, wherein each of said memory cells connected to said first bit line and said first inverted bit line and to said second bit line and said second inverted bit line includes two storage elements having a magnetoresistance effect and two transistors.

14. The memory device according to claim 13, further comprising:

a first latch circuit for storing write data for said first bit line, and a second latch circuit for storing write data for said second bit line, wherein
said first and second latch circuits include sense amplifiers.

15. The memory device according to claim 2, wherein said first pair line includes a first auxiliary bit line paired with said first bit line and connected with no memory cell, and said second pair line includes a second auxiliary bit line paired with said second bit line and connected with no memory cell.

16. The memory device according to claim 15, wherein each of memory cells connected to said first bit line and to said second bit line includes a storage element having a magnetoresistance effect and a transistor.

17. The memory device according to claim 16, wherein said storage element exhibiting a magnetoresistance effect includes a TMR element exhibiting a ferromagnetic tunnel effect.

18. The memory device according to claim 16, further comprising a reference bit line and an auxiliary reference bit line, wherein a reference memory cell including a resistance element and a transistor is connected to said reference bit line.

19. The memory device according to claim 18, further comprising:

a first latch circuit for storing write data for said first bit line, a second latch circuit for storing write data for said second bit line, and a sense amplifier connected with at least said reference bit line and provided independently of said first latch circuit and said second latch circuit.

20. A memory device comprising:

a first bit line; and a second bit line having a current path independently of said first bit line, said memory device rendering write current paths of said first bit line and said second bit line in common by connecting said write current path of said first bit line with said write current path of said second bit line in series.

* * * * *